United States Patent [19]

Aoki

[11] Patent Number: 5,199,994
[45] Date of Patent: Apr. 6, 1993

[54] IMPURITY DOPING APPARATUS

[75] Inventor: Kenji Aoki, Tokyo, Japan

[73] Assignee: Seiko Instruments Inc., Tokyo, Japan

[21] Appl. No.: 623,164

[22] Filed: Dec. 6, 1990

[30] Foreign Application Priority Data

Dec. 6, 1989 [JP] Japan ................... 1-318555

[51] Int. Cl.⁵ ............................... H01L 21/00
[52] U.S. Cl. .................... 118/724; 156/345; 118/719; 118/715
[58] Field of Search ............... 118/715, 724, 719, 733; 437/141; 156/345

[56] References Cited

U.S. PATENT DOCUMENTS

| R. 33,326 | 9/1990 | Ebata et al. | 118/725 |
| 3,506,508 | 4/1970 | Nickl | 437/225 |
| 4,100,310 | 7/1978 | Ura et al. | 427/255.1 |
| 4,855,258 | 8/1989 | Allman et al. | 437/241 |
| 4,940,505 | 7/1990 | Schachameyer et al. | 437/946 |
| 4,962,726 | 10/1990 | Matsushita et al. | 118/725 |

OTHER PUBLICATIONS

"VLSI Fabrication Principles; Silicon and Gallium Arsenide"; by Sorab Ghandhi; ©1982; John Wiley & Sons; New York, N.Y., pp. 141-176.

Primary Examiner—Brian E. Hearn
Assistant Examiner—George Goudreau
Attorney, Agent, or Firm—Spensley, Horn, Jubas & Lubitz

[57] ABSTRACT

Impurity doping apparatus composed of a vacuum chamber, a heater for heating a silicon substrate in the chamber, and a gas supply source for supplying a diborane gas containing an impurity component of boron to the chamber. A regulating valve is disposed between the chamber and the gas supply source to regulate gas flow rate. A CPU is provided to control the heater and the regulating valve according to a given sequence of first, second and third procedures so as to dope the boron into the silicon substrate. The CPU operates according to the first procedure to effect heating of the silicon substrate in the vacuum chamber to activate a surface of the silicon substrate. The CPU operates according to the second procedure to effect charging of the diborane gas into the vacuum chamber while heating the silicon substrate to deposit a boron adsorption film on the activated surface. The CPU operates according to the third procedure to effect annealing of the substrate to diffuse the boron from the adsorption film into the bulk of the silicon substrate.

9 Claims, 6 Drawing Sheets

IMPURITY DOPING APPARATUS

BACKGROUND OF THE INVENTION

The present invention relates to an impurity doping apparatus utilized to form an impurity region having a desired conductivity type and resistivity in the fabrication of semiconductor devices such as bipolar transistors and Metal-Insulator-Semiconductor (MIS) field effect transistors.

The conventional impurity doping apparatus is typically composed of an ion implantation device. The ion implantation device is composed of an ion source, a mass spectrometer and an accelerating tube. The ion implantation is effected such that impurity atoms are ionized by the ion source, then an objective ion species is separated by the mass filter, and further the separated ion particles are accelerated by given energy with the accelerating tube to implant the ion particles into the semiconductor surface. The ion implantation device has advantages in that the doping amount of the impurity is controlled accurately, and the impurity doping can be easily effected through an insulating film. Therefore, the ion implantation device is generally used in conventional semiconductor fabrication processes.

However, conventional ion implantation devices have various drawbacks as follows. Namely, since impurity ions are accelerated to implant the impurity, the semiconductor surface of a sample may experience damage due to the kinetic energy of the impurity ions. Further, since the energy of the accelerated impurity ion particles fluctuates according to a Gaussian distribution having variance determined by the accelerating energy, the depth profile of the impurity atom density is rather broad in the semiconductor bulk, thereby making difficult the formation of a shallow impurity layer and the formation of a sharp depth profile in a deep part of the semiconductor layer. Moreover, since the ion particles are accelerated linearly, the introduction of impurity ion particles is unidirectional. Therefore, when carrying out oblique ion implantation in order to avoid channeling, asymmetricity is caused in the semiconductor device characteristics due to shadowing effects.

SUMMARY OF THE INVENTION

In view of the above noted drawbacks of the prior art, an object of the invention is to provide a new impurity doping apparatus effective to dope impurities into the semiconductor surface without causing damage, to form a sharp depth profile of the doped impurity atoms, and to carry out non-directional doping of the impurities.

In order to achieve the above and other objects, the inventive impurity doping apparatus is composed of a vacuum chamber for storing therein a semiconductor substrate, a heater for heating the semiconductor substrate in the vacuum chamber, a gas supply source for charging the vacuum chamber with gases, and a regulating valve disposed between the vacuum chamber and the gas supply source for controlling gas species and charging amount of gas. Further, the apparatus is provided with a controlling and processing unit for controlling the heater and the regulating valve according to a given sequential procedures. This controlling and processing unit operates according to a first procedure to control the heater to heat a semiconductor substrate to a given temperature for a given time interval so as to effect activation treatment of a surface of the semiconductor substrate. Then the controlling and processing unit controls the heater and the regulating valve according to a second procedure to selectively introduce a source gas containing an impurity component into the vacuum chamber for a given amount while heating the semiconductor substrate to effect an adsorption treatment such that an impurity adsorption film is deposited on the active surface of the semiconductor substrate. Further, the controlling and processing unit controls the heater according to a third procedure to heat the semiconductor substrate to a given temperature for a given time interval to effect a treatment whereby the impurity is diffused from the adsorption film into the semiconductor substrate.

Preferably, the controlling and processing unit has a circuit operative according to the first procedure to control the regulating valve to introduce into the vacuum chamber a gas species effective to facilitate the activation treatment.

Preferably, the gas supply source contains a hydrogen gas for facilitating the activation treatment and a diborane gas containing an impurity component of boron. The vacuum chamber may be composed of quartz.

Preferably, the inventive impurity doping apparatus includes an evacuation system for evacuating the vacuum chamber and an analysis system for analyzing discharged gas components. The controlling and processing unit includes a circuit operative according to the first procedure to detect the end of the activation treatment based on the analysis results. The analysis system is composed of a quadrupole mass spectrometer operative to detect quantitative changes in the SiO released from the semiconductor substrate of silicon.

The inventive impurity doping apparatus carries out the impurity doping based on chemical adsorption of impurity atoms on the semiconductor surface. The apparatus regulates the substrate temperature and the charging rate of the source gas containing the impurity component so as to control the impurity adsorption amount to accurately set the impurity dose. Therefore, the apparatus can effect uniform diffusion of the impurity from the semiconductor surface into the semiconductor bulk. Moreover, the impurity is doped without causing damage on the semiconductor substrate surface. Further, the inventive apparatus can be operated to form a shallow junction because a diffusion source is deposited on the semiconductor substrate in the form of an impurity adsorption film.

BRIEF DESCRIPTION OF THE DRAWING

FIGS. 2-1A-1C are simplified elevational views illustrating successive stages in a first impurity doping process performed with the apparatus of FIG. 1.

FIGS. 2-2A-2D are simplified elevational views illustrating successive stages in a second impurity doping process performed with the apparatus of FIG. 1.

FIGS. 2-3A-3C are simplified elevational views illustrating successive stages in a third impurity doping process performed with the apparatus of FIG. 1.

DESCRIPTION OF THE PREFERRED EMBODIMENTS

Hereinafter, the inventive impurity doping apparatus is described in detail with reference to the drawings.

Figure 1:
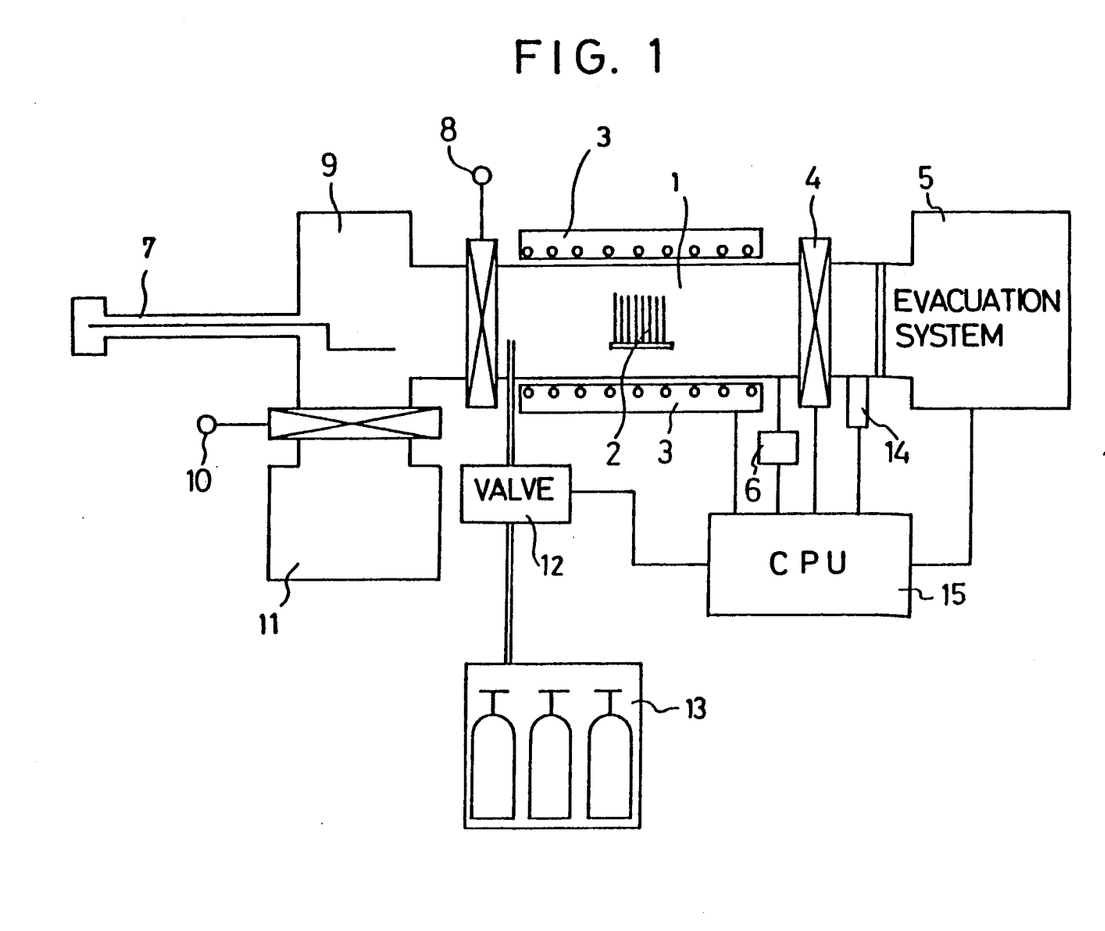
FIG. 1 is a simplified pictorial view of a preferred embodiment of impurity doping apparatus according to the present invention.
Figures 1A, 2:
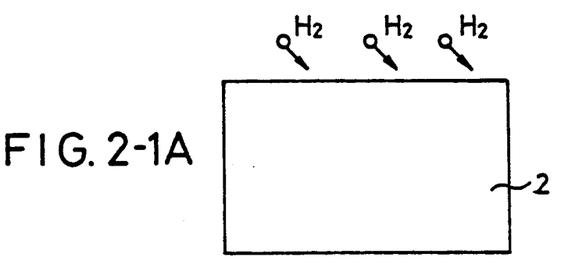
Figures 1B, 2:
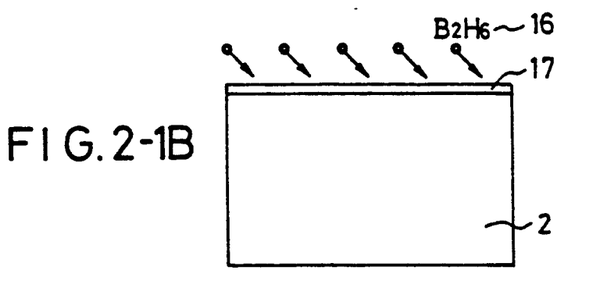
Figures 1C, 2:
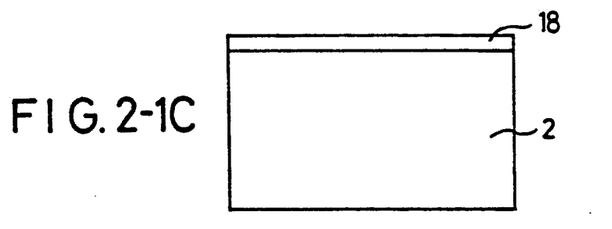
Figures 2, 2A:
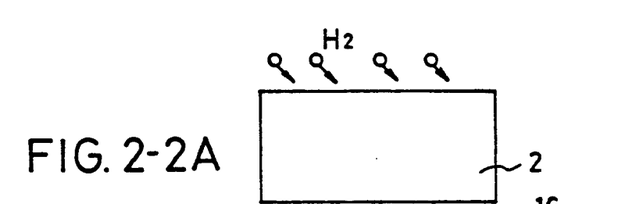
Figures 2, 2B:
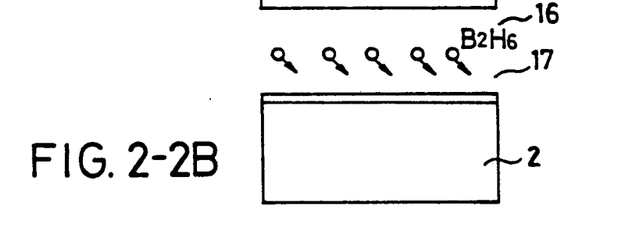
Figures 2, 2C:
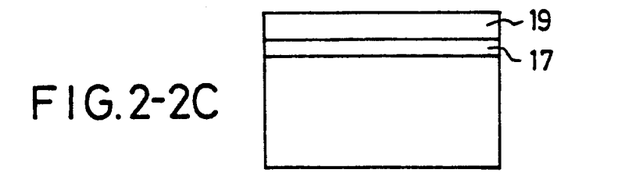
Figures 2, 2D:
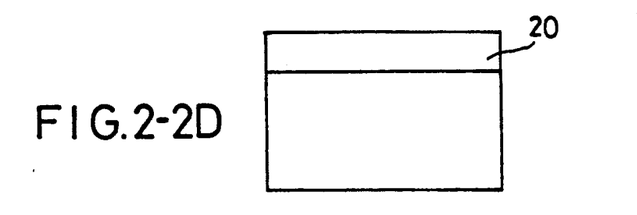
Figures 2, 3A:
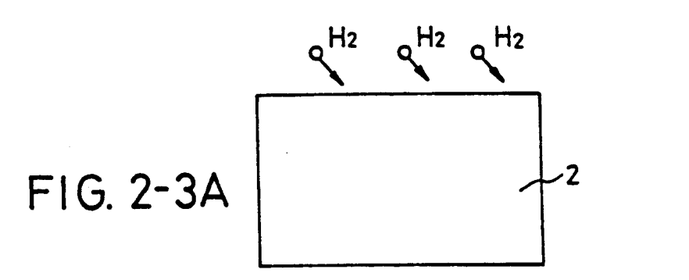
FIG. 3 is a process sequence chart illustrating one impurity doping procedure performed with the apparatus of FIG. 1.
Figures 2, 3B:
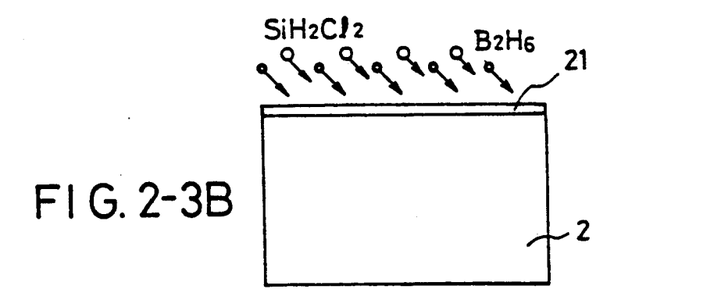
Figures 2, 3C:
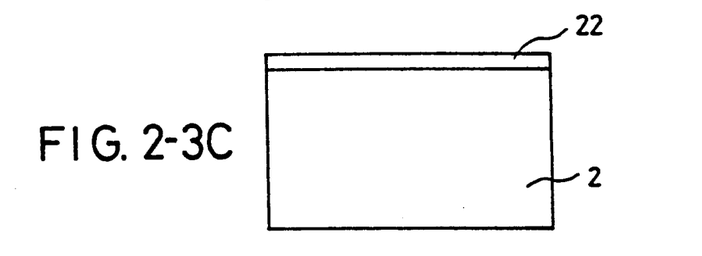

FIG. 1 is a block diagram showing one embodiment of the inventive impurity doping apparatus. The apparatus is composed of a vacuum chamber 1 made of quartz. The vacuum chamber 1 is provided to receive a semiconductor substrate 2 for impurity doping. A heating unit 3 is disposed around the vacuum chamber 1 so as to heat the semiconductor substrate 2 by an infrared ray lamp or resistance heater. The heating unit 3 is controlled to regulate the temperature of the semiconductor substrate 2.

An efficient evacuation system 5 is connected to the vacuum chamber 1 through a gate valve 4. The efficient evacuation system 5 is composed of a plurality of pumps including a main pump in the form of a turbo molecular pump so as to evacuate the vacuum chamber 1 to high vacuum level. A pressure gage 6 is provided to continuously monitor the vacuum level in chamber 1.

The impurity doping apparatus is further provided with a transportation mechanism 7 for transporting the substrate 2. The transportation mechanism 7 is operated to transport the substrate 2 to the vacuum chamber 1 from a loading chamber 9 which communicates with chamber 1 through a gate valve 8 which is held open during transport of the substrate. The loading chamber 9 is normally evacuated to a high vacuum level by a loading chamber evacuation system 11 via a gate valve 10 which is held open except during the loading of substrate 2 into loading chamber 9 and during the transportation of substrate 2 to main chamber 1.

A gas supply source 13 is connected to vacuum chamber 1 through a gas regulating valve 12. The gas supply source 13 is provided with a plurality of bottles for storing various gas species needed for the impurity doping process. The gas regulating valve 12 is controlled to select the gas species, and regulate the amount of gas delivered to chamber 1 and length of time during which a gas is introduced from gas supply source 13 to vacuum chamber 1. The gas supply source 13 may contain a reducing gas such as hydrogen gas effective to facilitate the activation treatment of the substrate surface and an impurity gas such as diborane gas which contains an impurity component of boron.

An analyzer 14 is disposed in communication with the path between vacuum chamber 1 and efficient evacuation system 5 for analyzing exhaust gas components. The analyzer 14 may be composed of a quadrupole mass spectrometer.

Lastly, a controlling and processing unit 15 composed of a CPU is connected to control the operation of heating unit 3, regulating valve 12, gate valve 4, and evacuation system 5. The CPU is also connected to the pressure gage 6 and analyzer 14 to effect controlling and processing of the impurity doping apparatus in response to detection results from the pressure gage and analyzer.

FIG. 2-1 show successive stages of one example of a process for doping semiconductor substrate 2 composed of silicon with boron impurity, using the inventive impurity doping apparatus. In the step of FIG. 2-1A, a surface activation treatment is performed on silicon substrate 2, such that hydrogen gas ($H_2$) is applied to remove a natural oxide film from the substrate surface by a reductive reaction. Otherwise, the substrate 2 is simply heated in vacuum to activate the substrate surface. In such case, the hydrogen gas may be also added to efficiently remove the oxide film.

In the step of FIG. 2-1B, a diborane gas 16($B_2H_6$) having an impurity component of boron is introduced into the vacuum chamber while heating the silicon substrate 2 so as to form an impurity adsorption film 17 on the activated surface of the silicon substrate 2.

In the step of FIG. 2-1C, the semiconductor substrate 2 is annealed at a given temperature for a given time interval to carry out a treatment in which the impurity component, boron, is diffused into the silicon substrate 2 to form an impurity diffusion layer 18.

FIG. 2—2 show an example in which a silicon substrate 2 a multi-layer structure composed of an impurity adsorption film and semiconductor film is formed on substrate 2 so as to form an impurity diffusion layer using the inventive impurity doping apparatus. In the step of FIG. 2-2A, a surface activation treatment is performed on silicon substrate 2. Then in the step of FIG. 2-2B, an impurity adsorption film 17 is deposited on the activated surface of substrate 2 by placing diborane gas in contact with the activated surface. These steps are carried out in the same manner as in the previous example. Thereafter in the step of FIG. 2-2C, a gas mixture of hydrogen and either silane ($SiH_4$) or dichlorosilane ($SiH_2Cl_2$) is brought into contact with film 17 to deposit a semiconductor film 19 on film 17 to form a double layer structure. Lastly in the step of FIG. 2-2D, the semiconductor substrate 2 is heated to form an impurity diffusion layer 20.

FIGS. 2-3 show a further example in which a gas containing an impurity component and another gas containing a semiconductor component are simultaneously applied to a semiconductor substrate 2 made of silicon to facilitate activation of an impurity doping component so as to form an impurity diffusion layer having a relatively low resistivity, using the inventive impurity doping apparatus. In the step of FIG. 2-3A, a surface activation or cleaning treatment is carried on the surface of silicon substrate 2. In the step of FIG. 2-3B, diborane gas containing an impurity component of boron and dichlorosilane containing a semiconductor component of silicon are concurrently applied to the activated surface to form an adsorption film 21 composed of the impurity component and the semiconductor component. Then in the step of FIG. 2-3C, the semiconductor substrate 2 is annealed to form an impurity diffusion layer 22. The boron doping atoms are activated at a relatively high rate in the impurity diffusion layer 22 to achieve significantly low resistivity.

Figure 3:
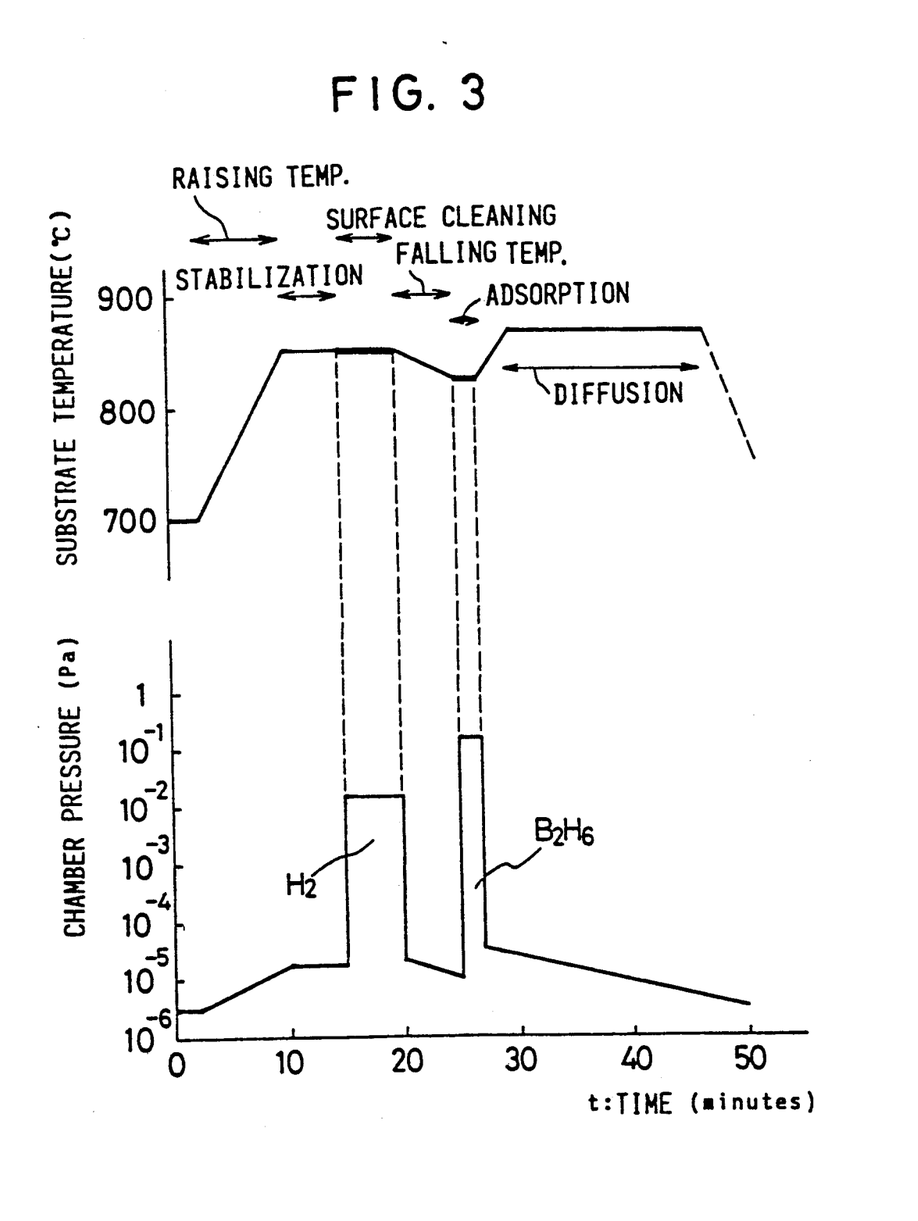

FIG. 3 is a sequence chart of the impurity doping process showing a sequential procedure programmed into the controlling and processing unit 15 of the FIG. 1 apparatus to effect the sequential treatments illustrated in FIG. 2-1. The controlling and processing unit 15 composed of a CPU controls the impurity doping apparatus according to the given process sequence or program so as to effect impurity doping. In the FIG. 3 process sequence chart, the horizontal axis indicates processing time, and the vertical axis indicates substrate temperature and the pressure during each processing interval in the vacuum chamber.

Hereinafter, a detailed description is given for operation of the FIG. 1 apparatus in conjunction with the process of FIG. 2-1 and FIG. 3. Firstly in order to effect surface activation treatment of the silicon substrate 2, the substrate 2 is placed in the center of vacuum chamber 1 which is held at a background or base pressure of less than $1\times10^{-4}$. In this state, the controlling and processing unit 15 operates according to the given program to control the heating unit 3 to set the substrate temperature at 850° C. After the substrate temperature is raised to and stabilized at the set temperature, the gas regulating valve 12 is controlled so that hydrogen gas is introduced from the gas supply source 13 into the vacuum chamber 1. The hydrogen gas is delivered for a given time interval so that the internal pressure of the vacuum chamber is raised to $1\times10^{-2}$ Pa. The internal pressure of the chamber is monitored by the pressure gage 6, and the controlling and processing unit 15 operates according to the monitored results to regulate the gas regulating valve 12. By such operation, a natural oxide film is removed from the surface of the silicon substrate 2 to expose a chemically active silicon face. Namely, the surface of the silicon substrate is cleaned and activated.

Next, an impurity adsorption treatment is effected according to the process sequence program. Namely, after finishing the cleaning of the silicon substrate surface, the controlling and processing unit 15 controls the gas regulating valve 12 to stop the delivery of hydrogen gas, and unit 15 concurrently controls the heating unit to set the substrate temperature at 825° C. After reaching and stabilizing at the set temperature, the gas regulating valve 12 is controlled so that diborane gas 16 containing the impurity component of boron is delivered into the chamber for a given time under the condition that the vacuum chamber pressure is raised to $1\times10^{-2}$ Pa. Consequently, the activated silicon surface is covered with the adsorption film 17 containing elemental boron or a boron compound.

Lastly, a diffusion treatment is carried out according to the process sequence program. Namely, after finishing the deposition of the impurity adsorption film 17, the regulating valve 12 is controlled to halt delivery of the diborane gas. Then, the high vacuum system 5 is operated to evacuate the interior of chamber 1 to a high vacuum state, i.e. less than $1\times10^{-4}$. In this state, the heating unit 3 is controlled to raise the substrate temperature to, for example, 875° C. This heating state is maintained for a given time interval to effect annealing of the substrate to carry out solid-phase diffusion of the impurity component from the diffusion source composed of the impurity adsorption film 17 to thereby form the impurity diffusion layer 18 near the surface of silicon substrate 2. Concurrently with this treatment, the boron impurity is activated. In the inventive impurity doping apparatus, the adsorption amount and annealing conditions such as substrate temperature and heating time interval are controlled by the controlling and processing unit 15 so as to form the impurity diffusion layer 18 having a desired impurity concentration and a desired junction depth. The amount of boron in the adsorption film can be adjusted to a desired value by controlling the regulating valve 12 to regulate the diborane gas charging pressure and delivery time interval.

The analyzer 14 is used to detect the end point, or time, of the surface activation or cleaning treatment in the inventive impurity doping apparatus. The analyzer 14 is composed, for example, of a quadrupole mass spectrometer for monitoring quantitative changes in SiO or $H_2O$ contained in the exhaust gas from the vacuum chamber 1 during the course of removal of the natural oxide film on the silicon substrate 2.

Figure 4:
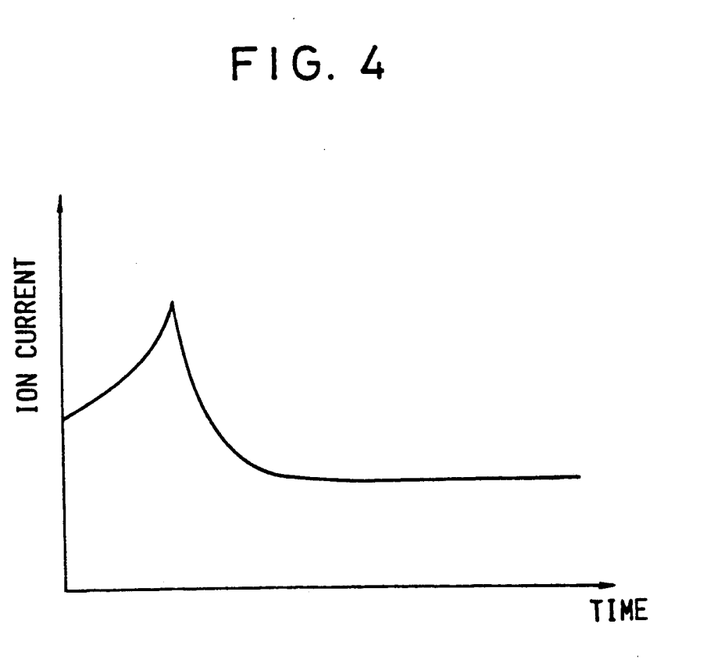
FIG. 4 is a graph showing a time-dependent change of ion current of a quadrupole mass spectrometer, which corresponds to the quantitative change of SiO contained in gas discharged from the apparatus of FIG. 1 during the course of a process performed therein.

FIG. 4 is a graph showing change in ion current of the quadrupole mass spectrometer, which corresponds to the quantitative change in the SiO component of the exhaust gas. As shown in the graph, when the removal of the natural oxide film progresses on the silicon substrate, the exhaust amount of SiO increases since SiO is released from the silicon substrate. Then, when the natural oxide film is completely eliminated from the substrate surface, the SiO exhaust amount abruptly decreases to a background level. The controlling and processing unit 15 can detect the end point of the silicon surface activation treatment while monitoring changes in the ion current of the analyzer 14. The controlling and processing unit 15 operates in response to this detection result to control the regulating valve 12 and the heating unit 3 to thereby proceed to the next step of adsorption treatment according to the given process sequence program.

The inventive impurity doping apparatus is thus capable of operating basically so that a chemically active semiconductor surface is formed with an adsorption film containing at least an impurity component in the form of a dopant for semiconductor material, and that the impurity doping is effected into the semiconductor from an impurity diffusion source composed of the adsorption film. According to the inventor's detailed study, it is found that an adsorption film is not substantially deposited on an inert film such as a natural oxide film in contrast to an active surface of silicon single crystal or polysilicon. Further, when thermal treatment is carried out after the adsorption treatment, only a trace of the adsorption film remains on an inert film in an amount less than one-tenth of that remaining on an active surface. In addition, it is recognized that an inert film blocks the diffusion of the adsorbed impurity into the bulk of a semiconductor. Therefore, it is quite important to carry out an activation or cleaning treatment of the substrate surface prior to the adsorption treatment of the impurity. In view of the above noted facts, the inventive impurity doping apparatus is designed to operate according to a given process sequence program to carry out automatically the activation or cleaning treatment of the semiconductor substrate. Development and installation of a specific program can be carried out in a manner well known in the art.

In the various above described examples, the inventive impurity doping apparatus is utilized to dope a P type of impurity boron into a silicon substrate by applying diborane gas to the substrate. However, the inventive apparatus may utilize other source compound gases of Group III elements such as trimethyl gallium (TMG) or boron trichloride ($BCl_3$) in order to dope the P type impurity component. On the other hand, the inventive apparatus can also utilize arsine ($AsH_3$), phosphorus trichloride ($PCl_3$), antimony pentachloride ($SbCl_5$) or phosphine ($PH_3$) in order to dope the silicon substrate with an N type impurity.

As described above, according to the invention, the impurity doping can be carried out automatically, according to a given process sequence program, by the sequential treatments of activating the semiconductor substrate surface, adsorbing the impurity on the activated surface, and diffusing the adsorbed impurity into the semiconductor bulk. The inventive apparatus carries out the impurity doping based on chemical adsorption, thereby achieving the advantage that the semiconductor substrate surface is not damaged in contrast to conventional ion implantation techniques. Further, the adsorption amount of impurity can be controlled accurately, thereby achieving the advantage that the impurity diffusion density and the diffusion depth can be regulated quite accurately. Moreover, since the impurity doping is based on chemical adsorption, the impurity doping is non-directional to thereby enable formation of a uniform diffusion layer over the semiconductor substrate surface.

This application relates to subject matter disclosed in Japanese Application Number 1-318555, filed Dec. 6, 1989, the disclosure of which is incorporated herein by reference.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. An impurity doping apparatus comprising: a vacuum chamber for receiving a semiconductor substrate:
   evacuation means for evacuating said vacuum chamber; heating means for heating the semiconductor substrate placed in said vacuum chamber;
   a gas supply source for supplying at least one gas species to said vacuum chamber;
   regulating valve means disposed between said vacuum chamber and said gas supply source for selecting a gas species to be supplied and for regulating the amount of the selected gas species supplied to said chamber;
   analyzing means communicating with said vacuum chamber and having an output connected to said controlling means for analyzing an exhaust component evacuated from said vacuum chamber; and
   controlling means operative according to a given sequence of first, second, third and fourth procedures to control said evacuation means, said heating means and said regulating means, said controlling means being operative according to the first procedure to evacuate said vacuum chamber, said controlling means being operative according to the second procedure to effect heating of the semiconductor substrate to a given temperature for a given time interval to activate a surface of the semiconductor substrate, said controlling means being operative according to the third procedure to effect delivery of a given amount of a gas species containing an impurity component into said vacuum chamber while heating the substrate to deposit an impurity adsorption film on the activated surface, wherein said controlling means includes means operative according to the second procedure to detect an end point of activation of the substrate surface based on analyzed results fed from said analyzing means, and said controlling means being operative according to the fourth procedure to effect annealing of the semiconductor substrate at a given temperature for a given time interval to diffuse the impurity component from the impurity adsorption film into the semiconductor substrate.

2. An impurity doping apparatus according to claim 1 wherein said controlling means includes means operative according to the second procedure to control said regulating valve means to introduce into said vacuum chamber a gas effective to facilitate activation of the semiconductor substrate surface.

3. An impurity doping apparatus according to claim 1 wherein said gas supply source comprises a first bottle for storing a hydrogen gas effective to facilitate activation of the semiconductor substrate surface, and a second bottle for storing a diborane gas containing an impurity component of boron.

4. An impurity doping apparatus according to claim 3 wherein said gas supply source comprises a third bottle for storing one of silane gas and dichlorosilane gas, effective to facilitate activation of the impurity component.

5. An impurity doping apparatus according to claim 3 wherein said gas supply source has a third bottle for storing one of silane gas and dichlorosilane gas together with a semiconductor component effective to form a semiconductor film in contact with the impurity adsorption film.

6. An impurity doping apparatus according to claim 1 wherein said vacuum chamber is composed of quartz.

7. An impurity doping apparatus according to claim 1 for doping a semiconductor substrate of silicon, wherein the exhaust component is SiO and said analyzing means comprises a quadrupole mass spectrometer for analyzing quantitative changes in SiO which is released from the semiconductor substrate of silicon during the course of activating the semiconductor substrate surface.

8. An impurity doping apparatus according to claim 1 for doping a semiconductor substrate of silicon, wherein the exhaust component is $H_2O$ and said analyzing means comprises a quadrupole mass spectrometer for analyzing quantitative changes in $H_2O$ which is released from the semiconductor substrate of silicon during the course of activating the semiconductor substrate surface while using a reducing gas of hydrogen.

9. An impurity doping apparatus according to claim 1, wherein said controlling means are operative, during the first procedure, to evacuate said vacuum chamber to a background pressure of less than $10^{-4}$ Pa.

* * * * *